(12) United States Patent
Chou

(10) Patent No.: US 7,443,084 B2
(45) Date of Patent: Oct. 28, 2008

(54) MEANS FOR BEING ELECTRICALLY CONNECTED AN ELECTRODE OF A PIEZO-ELECTRIC PLATE

(75) Inventor: Chin-Wen Chou, Taipei Hsien (TW)

(73) Assignee: Zippy Technology Corp., Hsin Tien, Taipei Hsien (TW)

( * ) Notice: Subject to any disclaimer, the term of this patent is extended or adjusted under 35 U.S.C. 154(b) by 534 days.

(21) Appl. No.: 11/137,327

(22) Filed: May 26, 2005

(65) Prior Publication Data

US 2006/0267456 A1      Nov. 30, 2006

(51) Int. Cl.
  *H01L 41/08* (2006.01)
(52) U.S. Cl. ..................................... 310/345
(58) Field of Classification Search ................. 310/328, 310/334, 366, 338, 345, 346, 348, 311; *H01I 41/08*
  See application file for complete search history.

(56) References Cited

U.S. PATENT DOCUMENTS

| | | | | |
|---|---|---|---|---|
| 3,903,733 A | * | 9/1975 | Murayama et al. | 310/328 |
| 4,458,173 A | * | 7/1984 | Kaufman et al. | 310/338 |
| 4,492,892 A | * | 1/1985 | Nakatani | 310/345 |
| 4,857,887 A | * | 8/1989 | Iten | 341/34 |
| 5,296,777 A | * | 3/1994 | Mine et al. | 310/334 |
| 5,925,974 A | * | 7/1999 | Yamamoto et al. | 310/348 |

FOREIGN PATENT DOCUMENTS

| | | | |
|---|---|---|---|
| TW | 527063 | | 4/2003 |
| TW | 527067 | | 4/2003 |
| TW | 535999 | | 6/2003 |
| TW | 535999 Y | * | 6/2003 |
| TW | M252149 U | | 12/2004 |

\* cited by examiner

*Primary Examiner*—Thomas M. Dougherty
*Assistant Examiner*—Karen B Addison
(74) *Attorney, Agent, or Firm*—Muncy, Geissler, Olds, & Lowe PLLC

(57) ABSTRACT

A means for being electrically connected to an electrode of a piezo-electric plate is adapted for connecting the piezo-electric plate to a circuit board disposed under the piezo-electric plate. The piezo-electric plate and the circuit board are respectively provided with a first electrode and a second electrode corresponding to the first electrode. The means includes a conductive element and an elastic element. The conductive element includes at least two connecting surfaces electrically connected to each other and respectively electrically connected to the first electrode and the second electrode. The elastic element is joined with the conductive element and located between the piezo-electric plate and the circuit board.

6 Claims, 5 Drawing Sheets

MEANS FOR BEING ELECTRICALLY CONNECTED AN ELECTRODE OF A PIEZO-ELECTRIC PLATE

FIELD OF THE INVENTION

The present invention relates to a means for being electrically connected to an electrode of a piezo-electric plate, and more particularly to a means for preferably electrically connecting a piezo-electric plate to a circuit board supplying power to the piezo-electric plate, and for further absorbing the vibrational energy.

BACKGROUND OF THE INVENTION

According to the design of a means for being electrically connected to a piezo-electric plate, the prevent inventor has disclosed in R.O.C. (Taiwan) Patent Publication No. 527067, R.O.C. (Taiwan) Patent No. M252149 and R.O.C. (Taiwan) Patent Publication No. 535999. In conventional technology, electrodes of the piezo-electric plate are individually electrically connected to power electrodes of a circuit board by a welding manner of electrically connecting line material, a pressing and connecting manner of electrically conductive and elastic sheet or other means for being electrically connected to the electrode so as to form a circuit. In order to eliminate the vibrational energy of the piezo-electric plate, an elastic element is disposed between the piezo-electric plate and the circuit board for absorbing the vibrational energy of the piezo-electric plate. According to the above-mentioned design, the means for being electrically connected to the electrode and the elastic element are disposed on the piezo-electric plate, and the direction of the means is perpendicular to that of the elastic element (i.e. the means for electrically connecting electrode is located bedside the piezo-electric plate, and the elastic element is located under the piezo-electric plate). Although the above-mentioned patent disclose a preferable constraining force capable of preventing the piezo-electric plate from escaping because of vibration the electrode must be welded in the manufacturing process so as to be effectively mounted. Thus, the manufacturing process is still complex. Furthermore, although R.O.C. (Taiwan) Patent Publication No. 527063 discloses that a means for being electrically connected to an electrode and an elastic element are firstly joined and disposed on a side of a receiving box and a piezo-electric plate is then disposed thereon, the elastic element only absorbs a little vibrational energy of the piezo-electric plate because the piezo-electric plate is in the vibrational state. Thus, if the piezo-electric plate of conventional technology is in the high vibrational state, it is easy to generate noise because the piezo-electric plate collides with the receiving box.

SUMMARY OF THE INVENTION

It is an object of the present invention to solve the above-mentioned disadvantages.

In order to achieve the foregoing objects, the present invention provides a means for being electrically connected to an electrode of a piezo-electric plate, and the means is adapted for connecting the piezo-electric plate to a circuit board disposed under the piezo-electric plate. The piezo-electric plate and the circuit board are respectively provided with a first electrode and a second electrode corresponding to the first electrode. The means includes a conductive element and an elastic element. The conductive element includes at least two connecting surfaces electrically connected to each other and respectively electrically connected to the first electrode and the second electrode. The elastic element is joined with the conductive element and located between the piezo-electric plate and the circuit board. Thus, the present invention can electrically connects the conductive element to the piezo-electric plate and the circuit board by easily manufacturing and assembling, and simultaneously the elastic element can preferably absorb the vibrational energy.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 1:
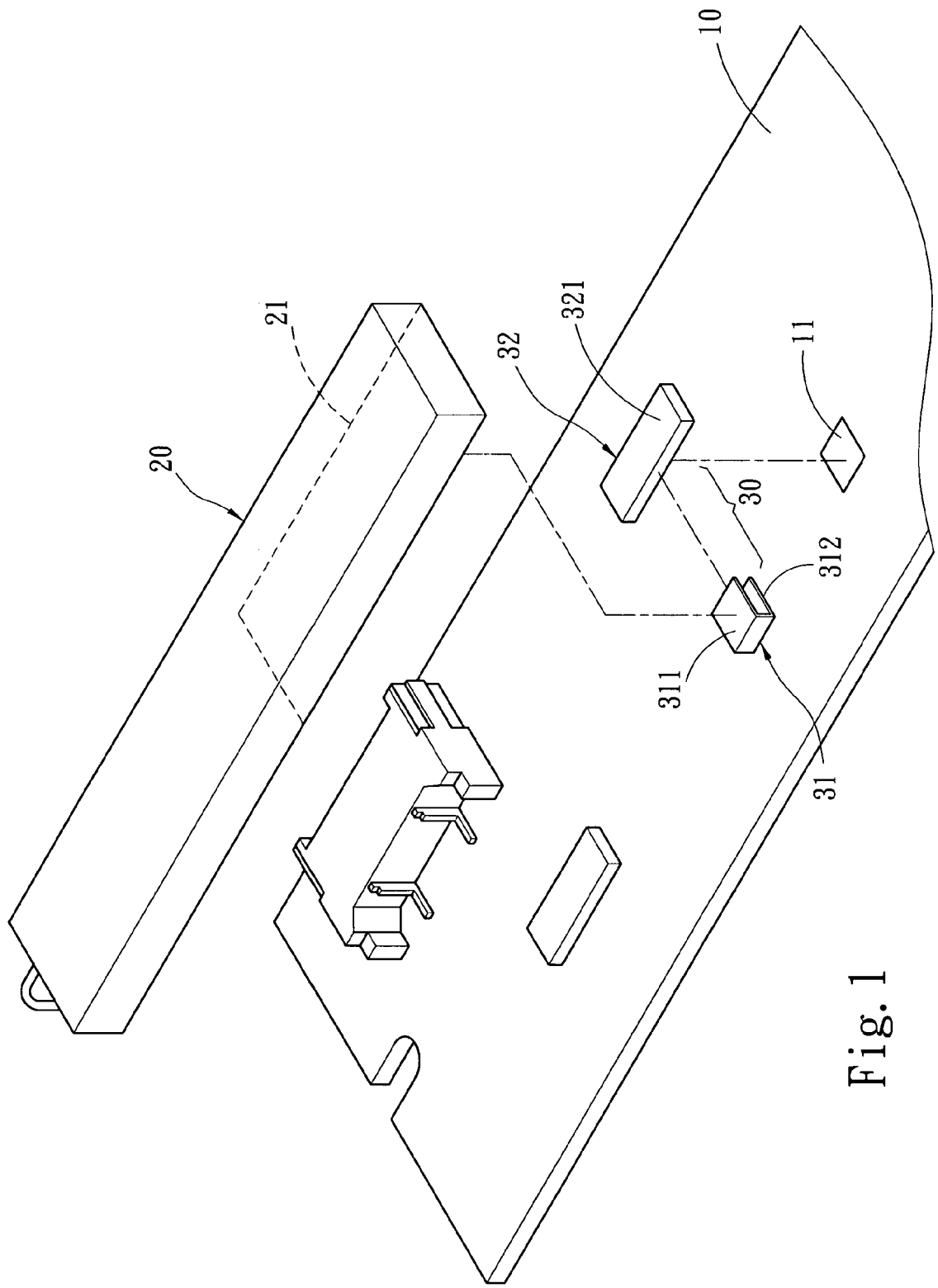
FIG. 1 is an exploded perspective schematic view of a means for being electrically connected to an electrode of a piezo-electric plate according to an embodiment of the prevent invention.
Figure 2:
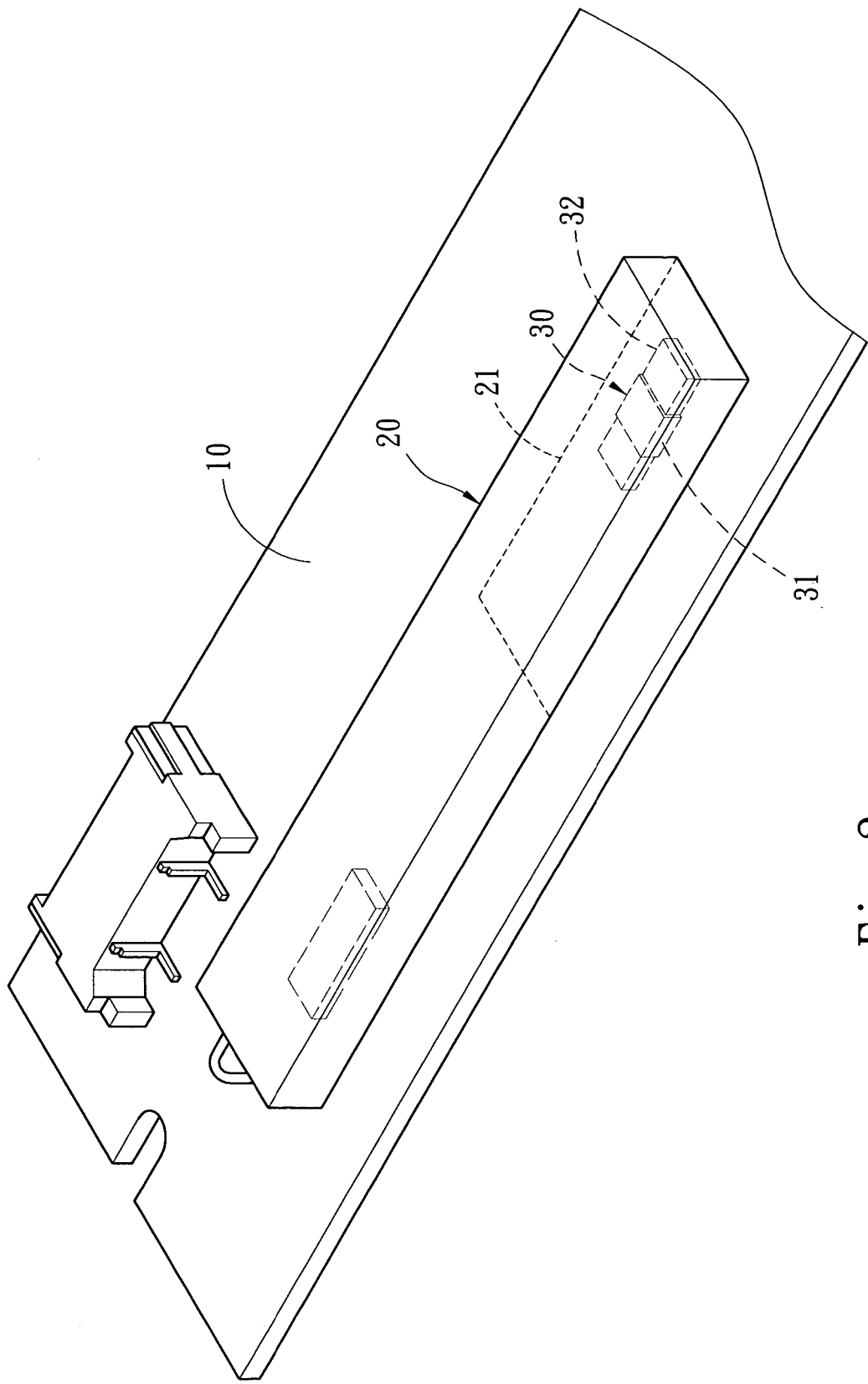
FIG. 2 is a perspective schematic view of a means for being electrically connected to an electrode of a piezo-electric plate according to an embodiment of the prevent invention.
Figure 3:
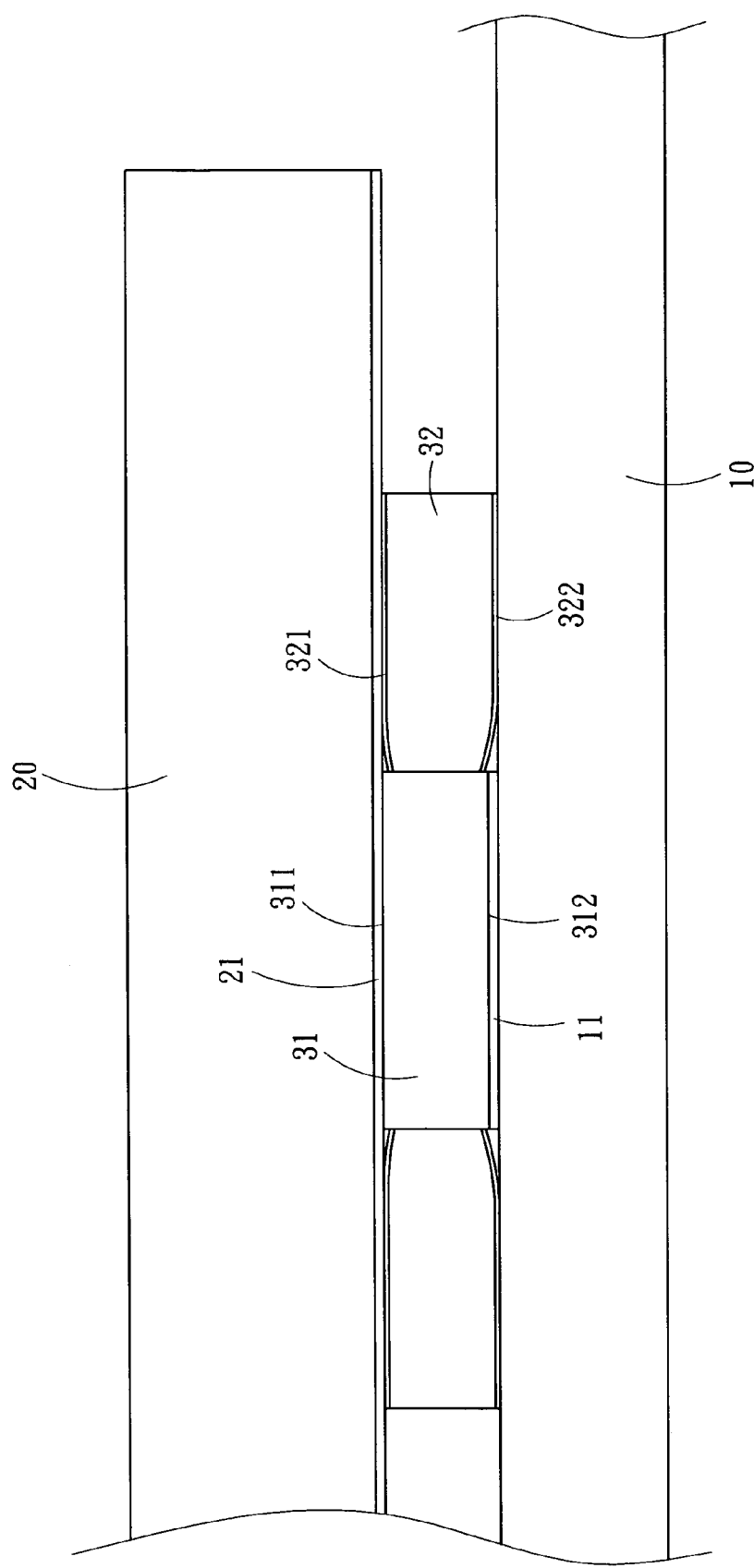
FIG. 3 is a cross sectional schematic view showing the combination of the prevent invention.
Figure 4:
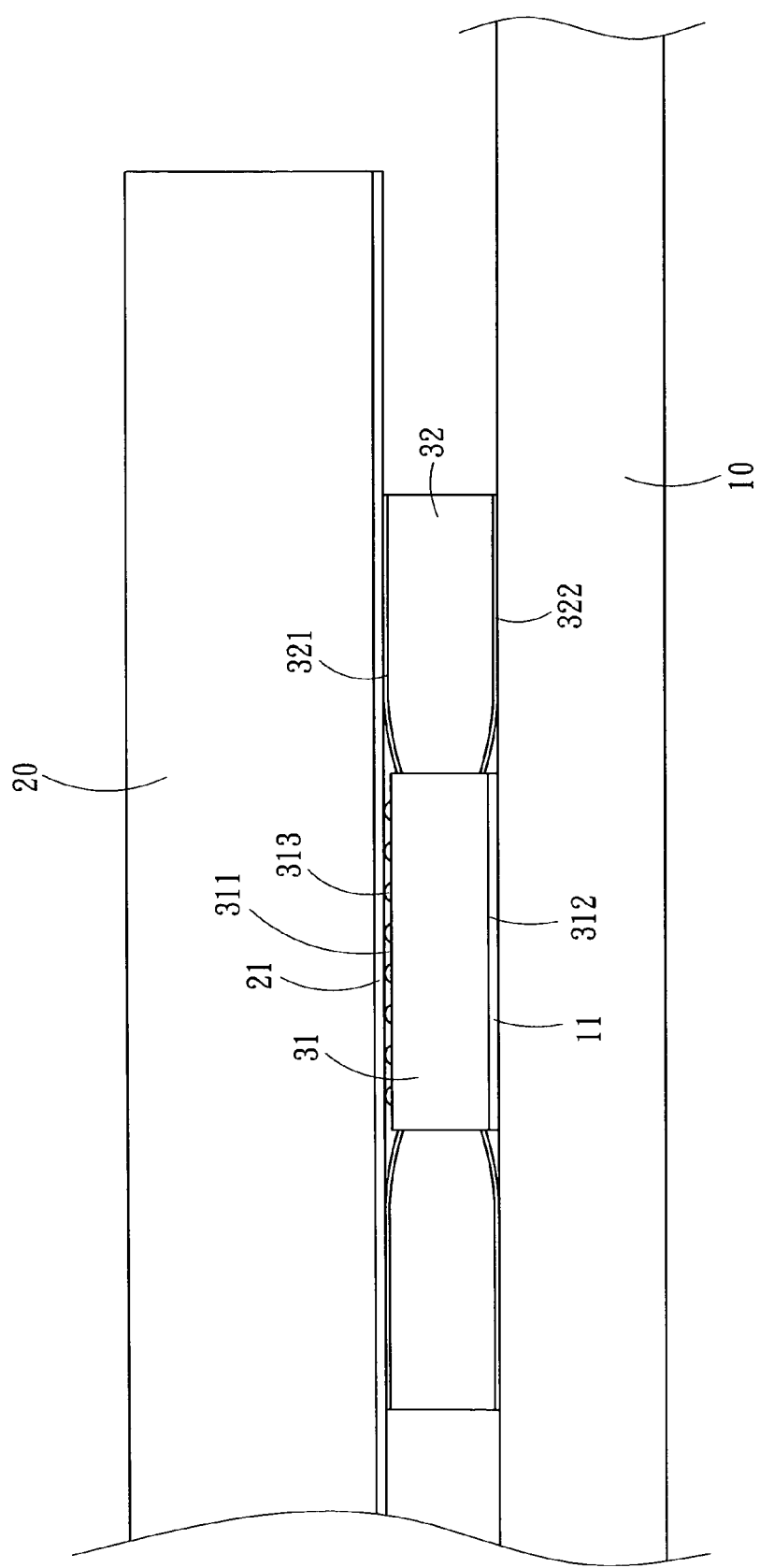
FIG. 4 is a cross sectional schematic view showing a means for being electrically connected to an electrode of a piezo-electric according to an alternative embodiment of the prevent invention.

Referring to FIGS. 1, 2 and 3, they are an exploded perspective view, a perspective view and a cross sectional view of a means for being electrically connected to an electrode of a piezo-electric plate of the prevent invention. The means 30 for being electrically connected to the electrode is adapted for connecting the piezo-electric plate 20 to a circuit board 10 disposed under the piezo-electric plate 20. The piezo-electric plate 20 and the circuit board 10 are respectively provided with a first electrode 21 and a second electrode 11, wherein the first electrode 21 and the second electrode 11 are corresponding to each other. The means 30 for being electrically connected to the electrode includes a conductive element 31 and an elastic element 32. The conductive element 31 includes at least two connecting surfaces 311, 312 electrically connected to each other and respectively electrically connected to the first electrode 21 and the second electrode 11. The elastic element 32 is joined with the conductive element 31 and located between the piezo-electric plate 20 and the circuit board 10. The elastic element 32 is disposed between the two connecting surfaces 311, 312 of the conductive element 31. The conductive element 31 can be C-shaped conductive sheet, shown in FIG. 1. Otherwise, the conductive element 31 can also be D-shaped conductive sheet. In a convenient manufacturing process, two surfaces of the elastic element 32 can be adhesive surfaces 321, 322 for being directly adhered to and positioning the conductive element 31, the piezo-electric plate 20 and the circuit board 10. In order to ensure that the piezo-electric plate 20 can be preferably electrically connected to the circuit board 10 and the area between the piezo-electric plate 20 and the circuit board 10 is larger, the adhesive surfaces 321, 322 of the elastic element 32 can be coated with conductive adhesive so as to enhance the electrically conductive effect. In additional, when the piezo-electric plate 20 is the state of vibrational energy, it is possible to affect the electrically conductive effect of the piezo-electric plate 20 because the connections of the adhesive surfaces 321, 322 are possibly fail. Thus, the connecting surfaces 311, 312 of the conductive element 31 can be provided with bumps 313, shown in FIG. 4, whereby the conductive element 31 certainly contacts the first electrode 21 of the piezo-electric plate 20 and the second electrode 11 of the circuit board 10, and the state of electrical connection is kept to be good.

Figure 5:
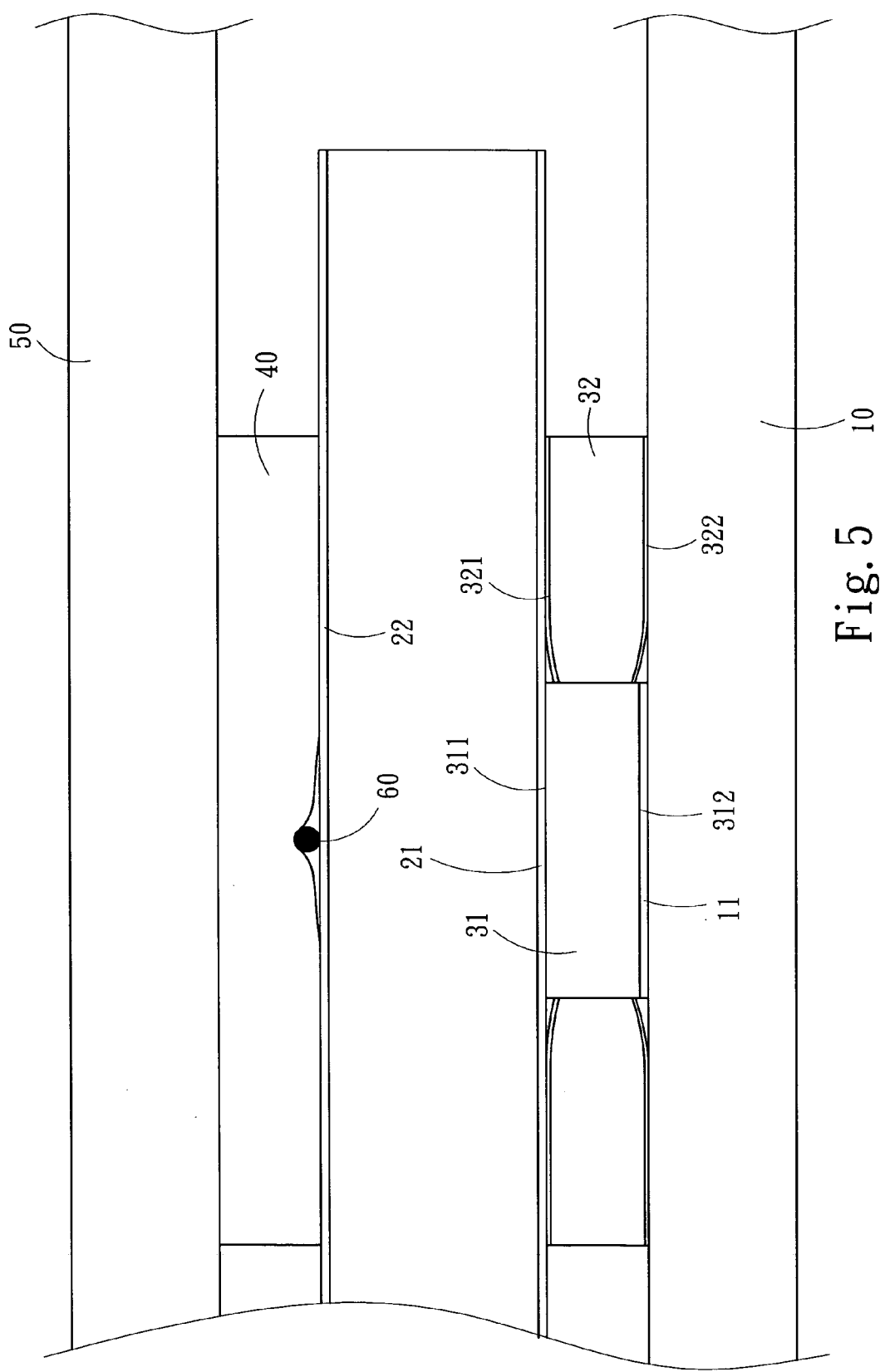
FIG. 5 is a cross sectional schematic view showing the combination according to another embodiment of the prevent invention.

In addition, another elastic element 40 and a positioning sheet 50 are further disposed above the piezo-electric plate 20, shown in FIG. 5. For example, according to the input electrode of the piezo-electric plate 20, the piezo-electric plate 20 includes not only the first electrode 21 disposed on the lower surface but also a third electrode 22 disposed on the upper surface. The third electrode 22 can be electrically connected to the circuit board 10 by means of conductive line material 60 or conductive sheet material. Also, the connection among the piezo-electric plate 20, the elastic element 40 and the positioning sheet 50 can be similar to the means 30 for being electrically connected to the electrode of the present invention, and the positioning sheet 50 is requested to provided with conductive traces (not shown) being electrically connected to the circuit board 10. The effect of the connection is similar to the means 30 for being electrically connected to the electrode of the present invention, and thus it is not requested to describe again in detailed.

As shown in FIGS. 3 and 5, it is apparent that the conductive element 31 of the present invention is positioned between the piezo-electric plate 20 and the circuit board 10 by means of the elastic element 32, whereby the conductive element 31 is surely electrically connected the first electrode 21 of the piezo-electric plate 20 and the second electrode 11 of the circuit board 10, and simultaneously the elastic element 32 absorbs the vibrational energy generated by the piezo-electric plate 20 and reduces the vibration so as to keep the original lifetime of the piezo-electric plate 20 and stably output the electric power.

Although the invention has been explained in relation to its preferred embodiment, it is not used to restrain the invention. It is to be understood that many other possible modifications and variations can be made by those skilled in the art without departing from the spirit and scope of the invention as hereinafter claimed.

What is claimed is:

1. A means for being electrically connected to an electrode of a piezo-electric plate, the means adapted for connecting the piezo-electric plate to a circuit board disposed under the piezo-electric plate, the piezo-electric plate and the circuit board respectively provided with a first electrode and a second electrode corresponding to the first electrode, the means comprising:

a conductive element comprising at least two connecting surfaces electrically connected to each other and respectively electrically connected to the first electrode and the second electrode, said at least two connecting surface being adhesive surfaces for positioning the conductive element, piezo-electric plate and the circuit board; and an elastic element joined with the conductive element and disposed between the two connecting surfaces of the conductive element and located between the piezo-electric plate and the circuit board.

2. The means for being electrically connected to an electrode of a piezo-electric plate according to claim 1, wherein the adhesive surfaces of the elastic element are coated with conductive adhesive.

3. The means for being electrically connected to an electrode of a piezo-electric plate according to claim 1, wherein the conductive element is C-shaped conductive sheet.

4. The means for being electrically connected to an electrode of a piezo-electric plate according to claim 1, wherein the conductive element is D-shaped conductive sheet.

5. The means for being electrically connected to an electrode of a piezo-electric plate according to claim 1, wherein the connecting surfaces are provided with bumps.

6. The means for being electrically connected to an electrode of a piezo-electric plate according to claim 1, wherein the piezo-electric plate is provided with another elastic element and a positioning sheet disposed above the piezo-electric plate.

* * * * *